United States Patent
Harvey

(10) Patent No.: US 6,535,064 B2
(45) Date of Patent: Mar. 18, 2003

(54) CURRENT-FEEDBACK AMPLIFIER EXHIBITING REDUCED DISTORTION

(75) Inventor: Barry Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/152,451

(22) Filed: May 21, 2002

(65) Prior Publication Data

US 2002/0175759 A1 Nov. 28, 2002

Related U.S. Application Data

(60) Provisional application No. 60/292,695, filed on May 22, 2001.

(51) Int. Cl.[7] .............................................. H03F 3/26
(52) U.S. Cl. ....................................... 330/265; 330/268
(58) Field of Search ................................ 330/263, 265, 330/267, 268

(56) References Cited

U.S. PATENT DOCUMENTS

| | | | |
|---|---|---|---|
| 4,446,443 A | * | 5/1984 | Johnson et al. ......... 330/265 X |
| 5,128,631 A | * | 7/1992 | Feliz et al. ............. 330/265 X |
| 5,973,563 A | * | 10/1999 | Seven ........................ 330/265 |

* cited by examiner

Primary Examiner—Steven J. Mottola
(74) Attorney, Agent, or Firm—Fliesler Dubb Meyer & Lovejoy LLP

(57) ABSTRACT

The disclosure describes a current feedback amplifier that contains an additional pair of emitter follower transistors connected between inputs of current mirrors, with a capacitor connected to the common emitters of the emitter follower transistors to reduce discontinuities in the output current provided from the current mirrors. The capacitor is used to turn on the non-dominant current mirror prior to the time it is required to dominate the output. In this manner, glitches introduced due to delays in a current mirror switching from an off state to an on state are significantly reduced.

13 Claims, 5 Drawing Sheets

CURRENT-FEEDBACK AMPLIFIER EXHIBITING REDUCED DISTORTION

CLAIM OF PRIORITY

This application claims priority to U.S. Provisional patent application No. 60/292,695, filed May 22, 2001, entitled AN IMPROVEMENT FOR CURRENT FEEDBACK AMPLIFIER OUTPUT STAGES, incorporated herein by reference.

FIELD OF THE INVENTION

The present disclosure relates to a current-feedback amplifier and more specifically to a current-feedback amplifier having reduced crossover distortion with phase delay eliminated.

RELATED ART

FIG. 1 depicts a generalized current-feedback amplifier (CFA). The circuit of FIG. 1 includes an input stage 10 and an output stage 20. The input stage 10 includes an input port (IN) providing a signal to the base of an NPN bipolar junction transistor (BJT) 104 and a PNP BJT 116. The collector of the transistor 104 is connected directly to a first common voltage line V+, while its emitter is connected through a current sink 114 to a second common voltage line V−. The collector of the transistor 116 is connected directly to V−, while its emitter is connected through current sink 120 to V+.

The input stage 10 further includes emitter follower transistors 124 and 132. A transistor 124 has a base connected to the emitter of transistor 116, while transistor 132 has a base connected to the emitter of transistor 104. The collector of the transistor 124 is connected to an input of a first current mirror 128. The collector of the transistor 132 is connected to an input of a second current mirror 136. The emitter transistor 124 and the emitter of transistor 132 are connected to form a common node n10. The current mirror 128 has an output connected to the output of the current mirror 136 at node n20. A capacitor 140 connects node n20 to ground.

In the output stage 20, the base of transistor 142 is connected to node n20, while its emitter is connected to V+ through a current source 146 and its collector is connected directly to V−. The base of a transistor 150 is also connected to node n20. The collector of the transistor 150 is connected directly to V+, while its emitter is connected to V− through a current sink 154.

The output stage 20 further includes emitter follower transistors 158 and 160. The base of transistor 158 is connected to the emitter of transistor 142, and the base of transistor 160 is connected to the emitter of transistor 150. The collector of transistor 158 is connected to V+, while the collector of transistor 160 is connected to V−. The emitter of transistor 158 and transistor 160 are connected together to form an output node n30. The output node n30 is connected by a feedback resistor 172, having a value $R_F$, to node n10. A load resistor 176, having a value $R_L$, connects the output node n30 to ground.

FIG. 2 depicts a simplified CFA that results if the fifth and sixth BJTs are replaced by diodes. FIG. 2 depicts an input stage 10A that is identical to the input stage 10 of FIG. 1. Note that components carried over from FIG. 1 to FIG. 2 are similarly labeled, as will be components carried over from FIG. 1 or other figures into subsequent figures. In the output stage 20A, the capacitor 140, transistors 142 and 150 and current sources 146 and 154 have been removed between the two current mirrors 128 and 136, relative to FIG. 1. The diodes 240 and 242 are connected in series between the current mirrors 128 and 136. The base of transistor 158 now connects to the output of the current mirror 128, while the base of transistor 160 connects to the output of current mirror 136.

The diodes 240 and 242 of the simplified CFA of FIG. 2 are replacements for emitter-followers used in the design of FIG. 1. Eliminating emitter-followers eliminates phase delay over frequency due to limited FT in the transistors. Therefore, the potential bandwidth may be extended beyond that of the classic CFA which includes emitter-followers. However, the downside of the diode replacement is that there is less current gain around the feedback loop. Nevertheless, reduced current gain increases the amplifier's output impedance and provides less suppression of internal distortion.

Often such a simplified CFA, as shown in FIG. 2, is used as an output stage within an overall amplifier. The bandwidth increase in the simple CFA allows more bandwidth in the externally compensated overall amplifier. Furthermore, the simple CFA is also much more linear than a simple emitter-follower output stage.

FIGS. 3 and 4 depict half sine wave input signals 300 and 400. The positive sine wave signal 300 is formed from a normal sine wave signal with all negative values of the sine wave attenuated. The negative sine wave signal 400 is formed from the same normal sign wave as is used to form the positive wave signal 300, however in the negative sine wave signal, all positive values for the sine wave are attenuated. The positive sine wave signal 300 is passed to the positive current mirror 128 and the negative sine wave signal 400 is passed to the negative current mirror 136. Each current mirror 128 and 136 replicates the signal on the output of the particular current mirror into which the signal is input.

Dynamic problems occur when trying to pass these half-sine waves 300 and 400. While devices will traverse trajectories of on-state to off-state fairly faithfully, it is very difficult for a device to immediately traverse from fully-off to suddenly on. In particular, when a current mirror is turned off, voltages across the devices composing the current mirror lag to small values at rates limited by the capacitances within the devices of the current mirror. Thus, there will be enough time for the current mirror's devices to turn fully off in the off half-cycle of current. From the fully off state, the current mirror is called upon to turn on during its off half-cycle. To pass the current in an undistorted manner, the voltages across the devices within the current mirror must come to an on-state virtually immediately. However, capacitances of the device terminals prevent that immediate change of voltage. Thus, the output of the current mirror will not accurately respond to the signal. This signal distortion caused by the rapid change in states demanded of the current mirrors is a form of cross-over distortion. At every zero crossing of output current the switching of current from one set of devices, an output error will be introduced into the signal due to the lag in current mirrors' response in switching from a fully off state to a fully on state. Therefore, what is needed is an amplifier that produces an amplified signal exhibiting less distortion at zero cross-over points.

SUMMARY

The disclosure describes a current feedback amplifier (FIG. 5) output stage that contains an additional pair of emitter follower transistors 538 and 540 with a capacitor 548 connecting the emitters of transistors 538 and 540 to ground to reduce discontinuities in the output current. The introduction of the pair of transistors 538 and 540 and the capacitor 548 allows each current mirror 128 and 136 to be turned on prior to the time the particular current mirror is required to control the output of the amplifier. By having the non-dominant current mirror capacitively turned on prior to the time it is required to dominate the output signal allows the non-dominant current mirror to more accurately replicate the input signal at the time it is required to dominate the output. Thus, signal glitches due to switching on of the current mirror, as occur in classic AB amplifiers as shown in FIG. 2, are avoided and less signal distortion results in the output signal.

DETAILED DESCRIPTION

Figure 5:
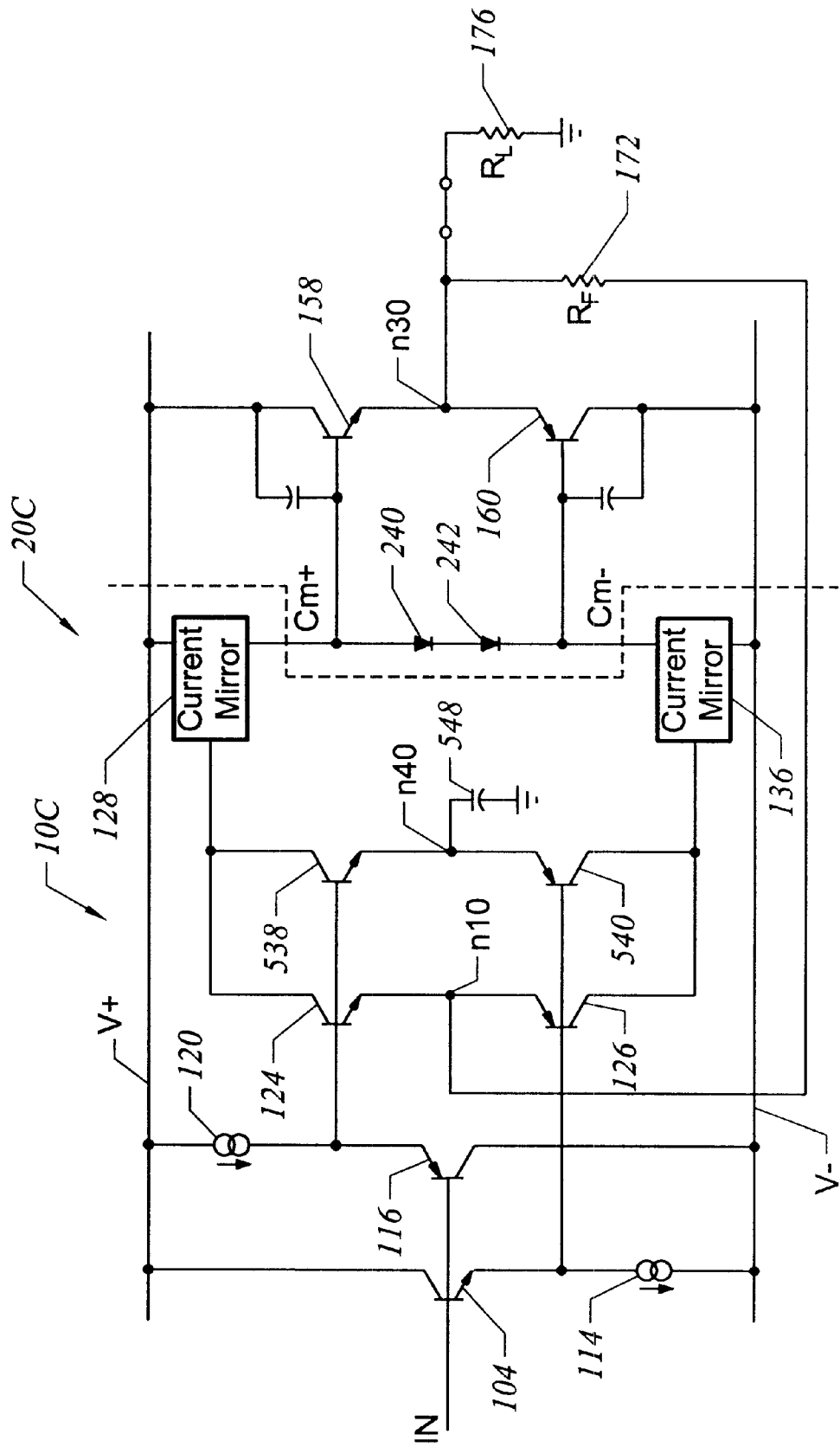
FIG. 5 is a schematic of an improved current feedback amplifier.

FIG. 5 depicts a current feedback amplifier that exhibits reduced output distortion. The circuit includes an input stage 10C and an output stage 20C. The output stage 20C is identical to the output stage shown in FIG. 2 and described above. The input stage 10C includes an input (IN) that is connected to deliver a signal to the base of transistor 104 and the base of a transistor 116, as in FIG. 2. The collector of transistor 104 is connected to V+, and its emitter is connected through a current sink 114 to V−, while the collector of transistor 116 is connected to V− and its emitter is connected through current sink 120 to V+, as in FIG. 2. Also, as in FIG. 2, transistors 124 and 132 are included with emitters connected in common forming a feedback connection node n10 for the feedback resistor 172. As in FIG. 2, the collector of transistor 124 is connected to the input of current mirror 128, the collector of transistor 132 is connected to the input of current mirror 136, the base of transistor 124 is connected to the emitter of transistor 116, and the base of transistor 132 is connected to the emitter of transistor 104.

Figure 1:
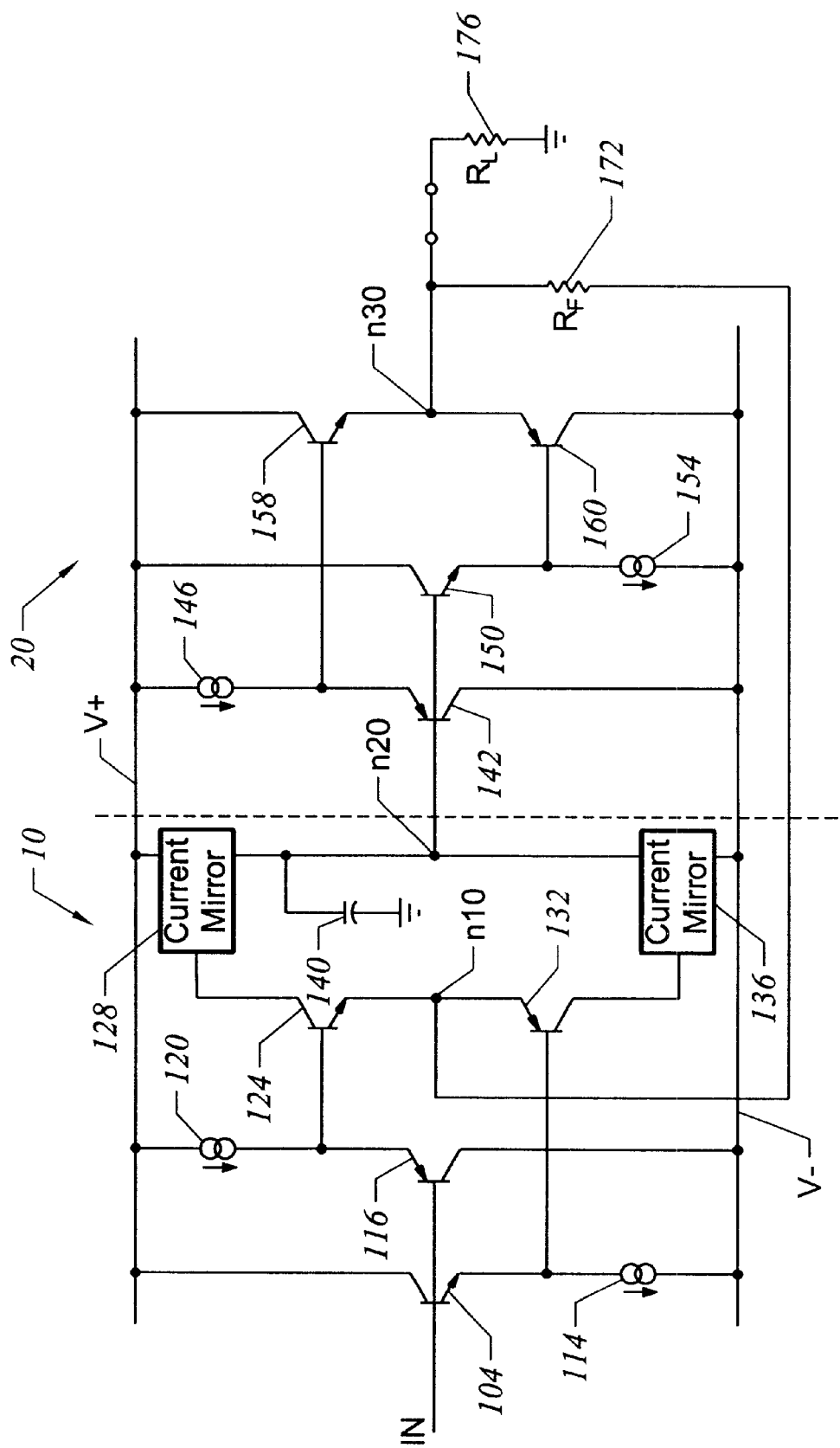
FIG. 1 is a prior art schematic of a current feedback amplifier.
Figure 2:
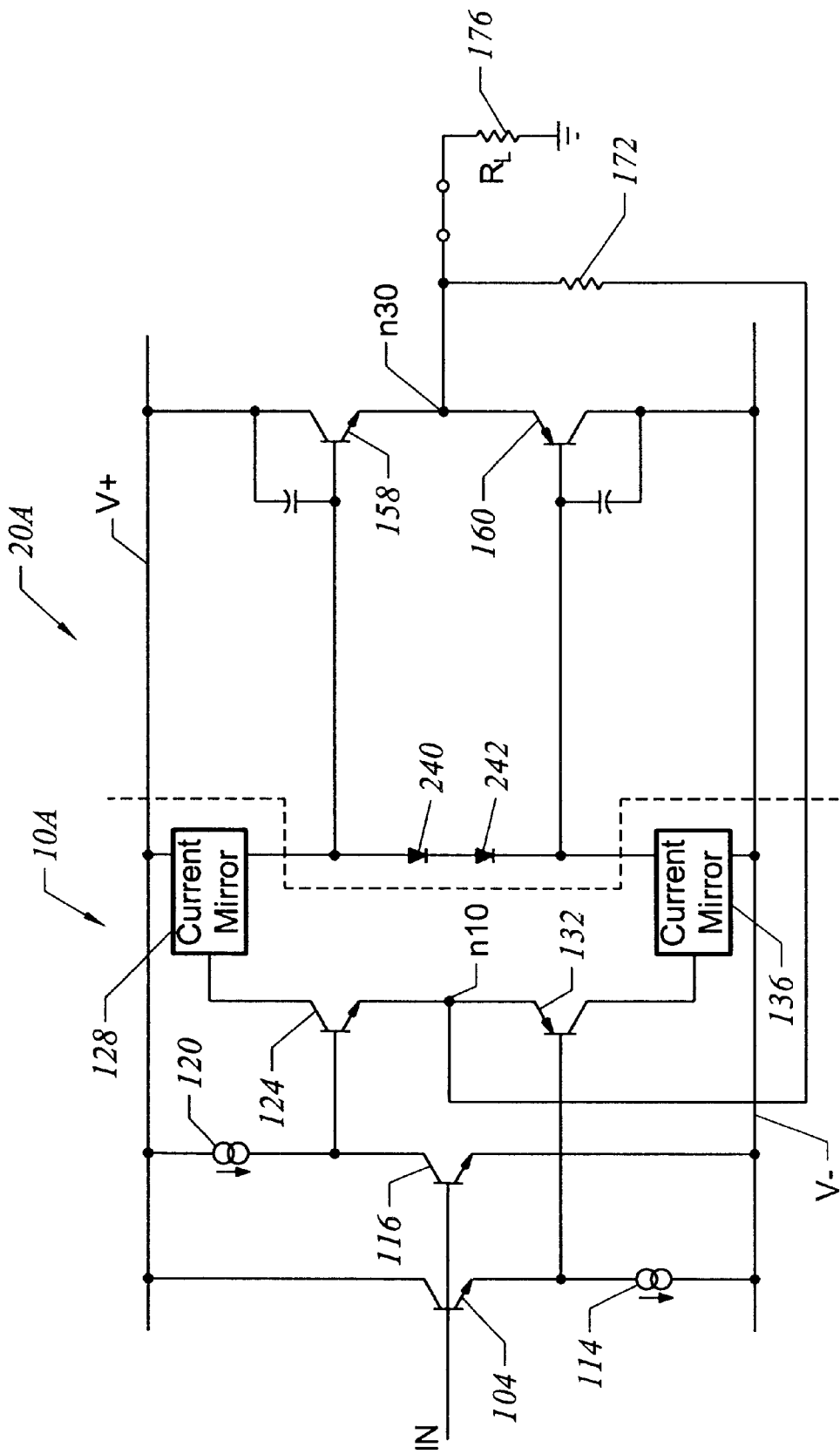
FIG. 2 is a prior art schematic of a simplifies current feedback amplifier.
Figure 3:
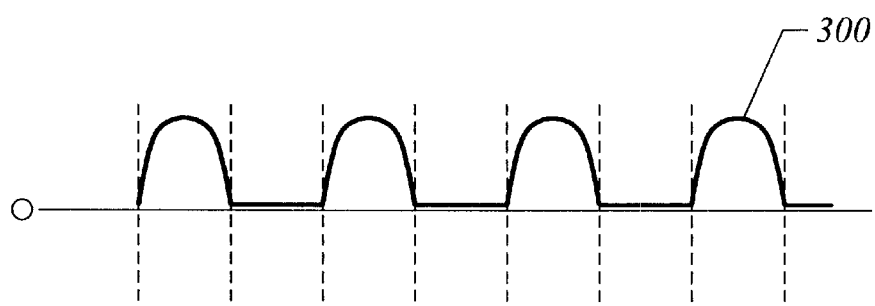
FIG. 3 depicts a base current output from transistor 158 of the circuit shown in FIG. 2.
Figure 4:
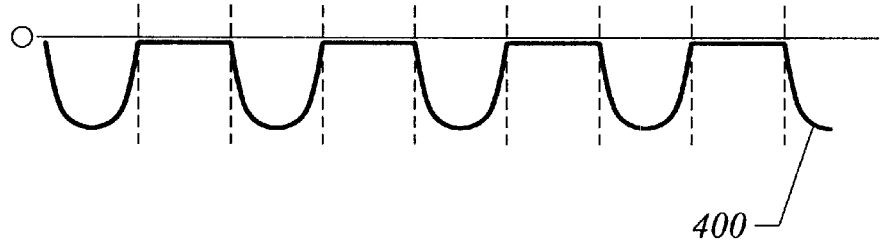
FIG. 4 depicts abase current output from transistor 160 of the circuit shown in FIG. 2.

Unlike in FIG. 2, the circuit of FIG. 5 includes a second pair of emitter follower transistors 538 and 540. The common emitters of transistors 538 and 540 form a node n40. The node n40 is connected by a capacitor 548 to ground. The base of transistor 538 is connected in common with the base of transistor 124 to the emitter of transistor 116. The base of transistor 540 is connected in common with the base of transistor 126 to the emitter of transistor 104. The collector of transistor 538 is connected to the input of current mirror 128, while the collector of transistor 540 is connected to the input of current mirror 136.

As noted above with regard to FIG. 5, the output stage 502 is identical to the output stage described with regards to FIG. 2. The output of current mirror 128 has been labeled Cm+, while the output of current mirror 136 has been labeled 136 for future reference. As described above, the node n40 is connected to node n10 through a feedback resistor 172.

In operation, the current from the capacitor 540 is delivered in class AB fashion through the first emitter follower transistors (538 and 540). The effect of summing those currents with the normal base currents of the emitter-follower device 158 and 160 is to provide an overlap time when the Cm+ and Cm− outputs of current mirrors 128 and 138 are active. For example, when the output Cm− of current mirror 136 is beginning to turn on, the output Cm+ current mirror 128 had already received some capacitive current from the capacitor 548 via transistor 158. Thus, even if the output Cm− of current mirror 136 delays in turning on, the output Cm+ of current mirror 128 can control the output of the device via transistor 160. Additionally, as the output Cm− of the current mirror 136 begins to turn on, more current is added to the output CM+ by current mirror 128 to oppose it feedback turns the first current mirror 128 off.

Figure 6:
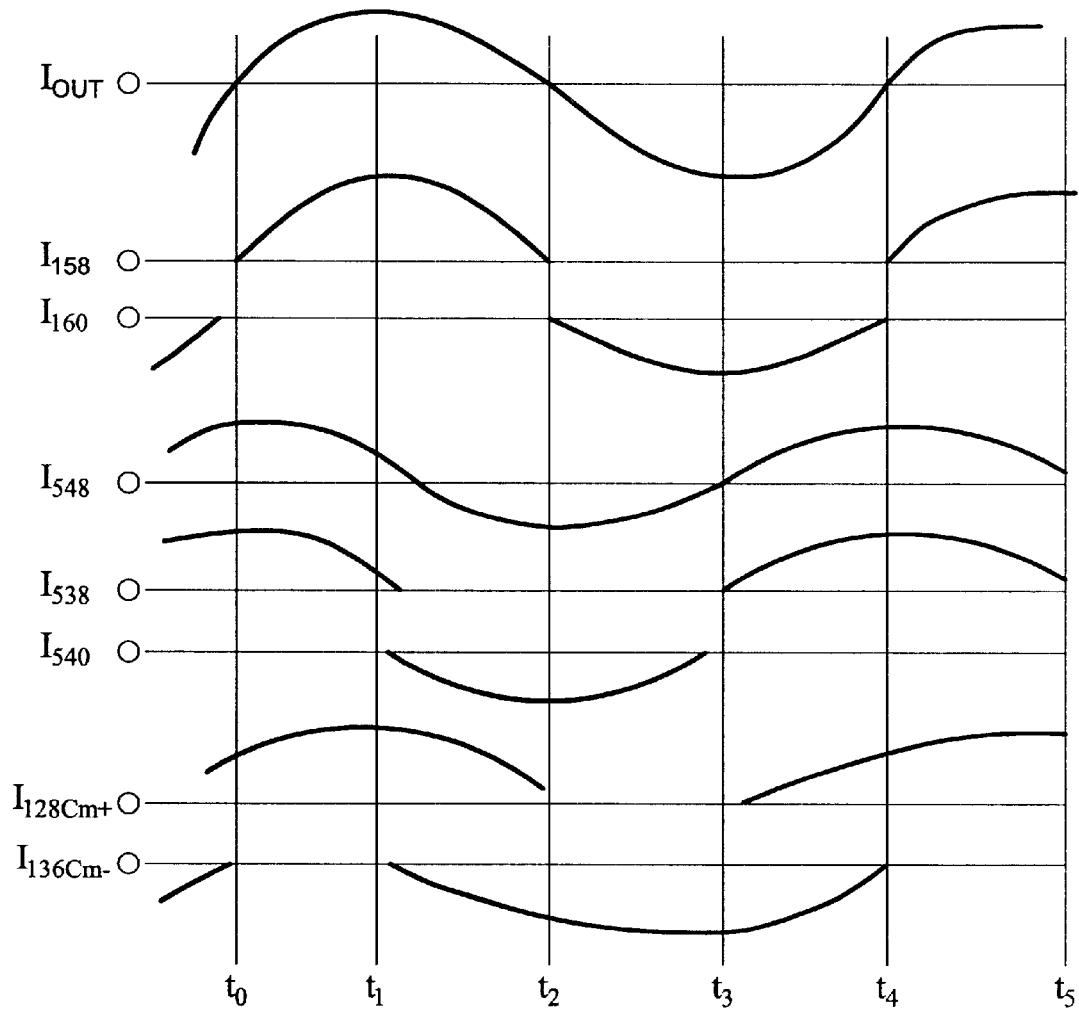
FIG. 6 depicts output currents for various elements of the circuits shown in FIG. 5, relative to a single time line.

FIG. 6 depicts an exemplary timing diagram for signals—Iout, I158, I160, I548, I538, I540, I128Cm+ and I136Cm—as they pass through the circuit shown in FIG. 5. Iout is the resultant signal passing out of the amplifier of FIG. 5. I158 is the base current signal provided to transistor 158. I160 is the base current signal provided to transistor 160. I548 is the current emitted at node n40 from the capacitor 548. I538 is current signal provided from the collector of transistor 538. I540 is the current signal provided from the collector of transistor 540. I128Cm+ is the current emitted from the output of current mirror 128 and I136 is the current emitted from the output of current mirror 136.

At time t0, Iout has a zero value and is increasing. Over the time period shown in FIG. 6, Iout varies in a sinusoidal fashion. The full period of the sine wave signal ends at t4, with a positive peak at t1, a negative peak at t3 and a zero crossing at t2. The output signal of the amplifier is generated by summing the outputs of two emitter-follower transistors 158 and 160. Transistor 556 regulates the positive portion of the output signal Iout and transistor 558 regulates the negative portion of the output signal Iout.

I548 is a sinusoidal signal that has maximum positive values at t0 and t4, a maximum negative value at t2 and zero crossings at t1, t3 and t5. At time t0, I548 is at its maximum positive value and is discharging in sinusoidal fashion as it delivers current to the current mirror 128 via emitter-follower transistor 538. At time t1, the capacitor 548 begins negatively charging in a sinusoidal fashion towards its peak value at t2. The negative charging of the capacitor 548 draws current from the current mirror 136 and thus begins to turn on the output Cm− current mirror 136 at time t1, before it is required to dominate the output at time t2.

At time t2, the capacitor 548 reaches the peak of the negative charge and begins to increase in charge towards its maximum positive value at t4. Between t1 and t3, current is drawn from the current mirror 136 via transistor 540. At time t3, no further current is drawn from current mirror 136 via transistor 540. The current draw on current mirror 136 turns on the output Cm− of current mirror 136 at time t1, before it required to dominate the output at time t2. Thus, the current mirror 136 is prepared to accurately replicate the received signal when it is required to do so at time t2.

At time t3, the capacitor 548 again begins positively charging and delivers current to the current mirror 128 via emitter-follower transistor 538. This activates the positive current mirror at time t3, before it is required to dominate the output at time t4. Thus, the current mirror 128 is prepared to accurately replicate the received signal when it is required to do so at time t4.

The charging a discharging of the capacitor 548 creates overlaps in the signals generated by the current mirrors 128 and 136. I128Cm+ shows that while the current mirror 128 dominates the output signal from time t0 to time t2 and from time t4 to time t6 (not shown), the current mirror 128 actually generating a signal from time t-1 (not shown) to time t2 and from t3 to time t6 (not shown). That is, the output Cm+ of current mirror 128 is turned on and begins generating a signal prior to the time the signal generated dominates the output signal Iout. Similarly with the current mirror 136 (signal I136Cm−)—the current mirror 128 is active from time t1 until time t4, but the current mirror signal I136Cm− only dominates the output between time t2 and time t4 on the output signal Iout. This scheme allows for a more gradual transition in the class AB operation. It is especially useful when transistors are biased at low operating currents, which otherwise would exacerbate the turn-on glitches.

An additional virtue of I548+I538+I540 is to provide slew current for the collector-base capacitance (CBC) of emitter follower transistor 158 and 160. At low output loads, the dominant signal currents through the current mirror 128 and the current mirror 136 slew the voltages of emitter-follower transistors 156 and 158. The lag currents through the current mirror 128 and the current mirror 136 might not be enough to slew the currents without cutting off the mirrors periodically as feedback current produces class AB switching. The currents in the capacitor 548 are correctly timed to prevent this cutoff. Furthermore, if the capacitance of the capacitor 548 is approximately equal to the collector base capacitance of emitter-follower transistors 158 and 160, the capacitor 548 signal will slew the collector-base capacitances of emitter-follower transistors 158 and 160 without cutting off the current mirrors 532 and 536 as occurs in typical class AB switching.

What is claimed is:

1. A current feedback amplifier exhibiting reduced distortion comprising:

an input line (IN);

a first common voltage line (V+);

a first current mirror (128) connected to said first common voltage line (V+);

a second common voltage line (V−);

a second current mirror (126) connected to said second common voltage line (V−);

a first transistor (104) having a base connected to said input line (IN), a collector connected to said first common voltage line (V+), and an emitter connected to said second common voltage line (V−) via a current sink (114);

a second transistor (116) having a base connected to said input line (IN), a collector connected to said second common voltage line (V−), and an emitter connected to said first common voltage line (V+) via a current sink (120);

a third transistor (124) having a base connected to said emitter of said second transistor (116), a collector connected to an input of said first current mirror (128) and an emitter forming a first node (n10);

a fourth transistor (126) having a base connected to said emitter of said first transistor (104), a collector connected to an input of said second current mirror (136), and an emitter connected to the first node (n10);

a fifth transistor (538) having a base connected to said emitter of said second transistor (116), a collector connected to said collector of said third transistor (124), an emitter connected to a second node (n40), said second node (n40) having an associated charge storage device (548);

a sixth transistor (540) having a base connected to said emitter of said first transistor (104), a collector connected to said collector of said fourth transistor (126), and an emitter connected to said second node (n40);

a first diode (240) having a first terminal connected to an output (Cm+) of said first current mirror (128) and having a second terminal;

a second diode (242) having a first terminal connected to the second terminal of the first diode (240) and a second terminal connected to an output (Cm−) of said second current mirror (136);

a seventh transistor (158) having a base connected to the first terminal of the first diode, a collector connected to said first common voltage line (V+), and an emitter connected to an output; and an eighth transistor (160) having a base connected to the second terminal of the second diode (242), a collector connected to said second common voltage line (V+), and an emitter connected to said output.

2. The current feedback amplifier of claim 1 wherein:

said first diode (240) is biased to cut off when current delivered from said first current mirror (128) reaches a first predetermined level.

3. The current feedback amplifier of claim 1 wherein:

said second diode (242) is biased to cut off when current delivered from said second current mirror (136) reaches a second predetermined level.

4. The current feedback amplifier of claim 1 wherein properties of said first and said second diodes (240,242) are selected such that only one of the first current mirror and the second current mirror will provide current to the output at a given time.

5. A current feedback amplifier comprising:

a first current mirror (128) having an input and an output (Cm+);

a second current mirror (136) having an input and an output (Cm−)

a first pair of emitter follower transistors (124,126) with collectors connected between the inputs of the first and second current mirrors (128, 136)

a second pair of emitter follower transistors (538,540) with collectors connected between the inputs of the first and second current mirrors (128, 136), and bases connected in common with corresponding transistors in the first pair of emitter follower transistors (124,126) to an input of the current feedback amplifier;

a capacitor (548) connected to emitters of the first pair of emitter follower transistors;

diodes (240,242) connecting the outputs (Cm+) and (Cm−) of the first and second current mirrors (128, 136)

a third pair of emitter follower transistors (158,160) having bases connected to respective ones of the outputs (Cm+, Cm−) of the first and second current mirrors (128, 136), emitters forming the output of the current feedback amplifier, and collectors connected between first and second power supply terminals (V+,V−).

6. The current feedback amplifier of claim 5, further comprising:

first and second input transistors (104,116) having bases connected in common forming an input of the current feedback amplifier, a collector of the first input transistor (104) being connected to the first power supply terminal (V+), and a collector of the second input transistor (116) being connected to the second power supply terminal (V−)

a first current sink (114) having a first terminal connected to the emitter of the first input transistor (104), and having a second terminal connected to the second power supply terminal (V−); and a second current sink (120) having a first terminal connected to the emitter of the second input transistor (116), and having a second terminal connected to the first power supply terminal (V+), wherein first terminals of the second current sink (120) and the first current sink (114) connected to bases of respective ones of the second pair of emitter follower transistors (538, 540).

7. The current feedback amplifier of claim 6, further comprising:

a feedback resistor (172) connecting the common emitters of the third pair of emitter follower transistors (158, 160) to the common emitters of the first pair of emitter follower transistors (124,126).

8. A method of generating a reduced distortion amplified signal comprising the steps of:

receiving a varying input signal having a first portion with values greater than zero and a second portion having values less than zero;

drawing current through a first signal generation device to generate a first amplified signal based on said first portion of said varying input signal;

storing current in a charge storage device in response to said first portion of said varying input signal;

delivering said stored current to activate a second signal generation device when said first portion of said varying input signal reaches a first predetermined value;

terminating delivery of said stored current to said second signal generation device when said varying input signal has a value less than zero; and drawing current through said second signal generation device to generate a second amplified signal based on said second portion of said varying input signal.

9. The method of generating a reduced distortion amplified signal of claim 8 further comprising the steps of:

storing current in said charge storage device in response to said second portion of said varying input signal;

delivering said stored current to activate said first signal generation device when said second portion of said varying input signal reaches a second predetermined value; and terminating delivery of said stored current to said first signal generation device when said varying input signal has a value greater than zero.

10. The method of generating a reduced distortion amplified signal of claim 9 wherein:

said first signal generation device is a first current mirror; and said second signal generation device is a second current mirror.

11. The method of generating a reduced distortion amplified signal of claim 9 wherein said charge storage device is a capacitor.

12. The method of generating a reduced distortion amplified signal of claim 8 wherein said first predetermined level is a maximum positive value of said input signal.

13. The method of generating a reduced distortion amplified signal of claim 8, wherein said second predetermined level is a maximum negative value of said input signal.

* * * * *